US012750068B2

(12) United States Patent
Chung et al.

(10) Patent No.: US 12,750,068 B2
(45) Date of Patent: Sep. 29, 2026

(54) APPARATUS AND METHOD FOR POWER REDUCTION IN A BIT FLIPPING DECODER

(71) Applicant: SK hynix Inc., Gyeonggi-do (KR)

(72) Inventors: Bi Woong Chung, Gyeonggi-do (KR); Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 18/603,215

(22) Filed: Mar. 13, 2024

(65) Prior Publication Data

US 2025/0150095 A1 May 8, 2025

(30) Foreign Application Priority Data

Nov. 6, 2023 (KR) ........................ 10-2023-0151658

(51) Int. Cl.
*H03M 13/00* (2006.01)
*H03M 13/11* (2006.01)

(52) U.S. Cl.
CPC .... *H03M 13/1128* (2013.01); *H03M 13/1108* (2013.01); *H03M 13/1151* (2013.01)

(58) Field of Classification Search
CPC ........... H03M 13/1108; H03M 13/255; H03M 13/2948; H03M 13/1128; H03M 13/1151
See application file for complete search history.

(56) References Cited

U.S. PATENT DOCUMENTS

| | | | |
|---|---|---|---|
| 8,464,134 B2 | 6/2013 | Alrod et al. | |
| 9,614,547 B2 | 4/2017 | Fainzilber et al. | |
| 10,075,190 B2 | 9/2018 | Achtenberg et al. | |
| 10,872,667 B2 * | 12/2020 | Lin | G11C 16/26 |
| 10,895,999 B2 * | 1/2021 | Hsiao | G11C 29/028 |
| 11,380,405 B2 * | 7/2022 | Yu | G11C 13/0035 |
| 12,218,681 B2 * | 2/2025 | Zlotnik | G11C 7/1009 |
| 12,301,254 B2 * | 5/2025 | Gad | H03M 13/3715 |
| 12,395,189 B2 * | 8/2025 | Furtek | H03M 13/116 |
| 2009/0282316 A1 * | 11/2009 | Lingam | H03M 13/11 714/763 |
| 2024/0128985 A1 * | 4/2024 | Jun | H03M 13/1105 |

OTHER PUBLICATIONS

Chakir Aqil et al., A New Reliability Ratio Weighted Bit Flipping Algorithm for Decoding LDPC Codes, Wireless Communications and Mobile Computing, p. 1-11, vol. 2021, May 17, 2021.

* cited by examiner

*Primary Examiner* — Esaw T Abraham
(74) *Attorney, Agent, or Firm* — IP&T GROUP LLP

(57) ABSTRACT

A memory system includes a memory device and a controller. The memory device is configured to output a codeword. The controller is configured to establish, from the codeword, a plurality of variable nodes and a plurality of check nodes, and schedule a decoding operation to ensure that a number of check-sum updates during one cycle of the decoding operation does not exceed a threshold set to be less than a number of the check nodes, wherein the decoding operation includes iterative operations, and each iterative operation includes plural sub-iterative operations.

8 Claims, 11 Drawing Sheets

$$H = \begin{Bmatrix} 1 & 0 & 1 & 0 & 0 & 0 \\ 1 & 1 & 0 & 1 & 1 & 0 \\ 0 & 0 & 1 & 0 & 1 & 1 \\ 0 & 0 & 0 & 1 & 0 & 1 \end{Bmatrix}$$

FIG. 11

| Module | Max. Value | Embodiment 1 | ... | Embodiment N |
| --- | --- | --- | --- | --- |
| Module1 | α | α↑ | ... | α |
| Decoder | β | β↓ | ... | β↓ |
| ... | ... | ... | ... | ... |
| Total | Ω | Ω | ... | Ω↓ |

APPARATUS AND METHOD FOR POWER REDUCTION IN A BIT FLIPPING DECODER

CROSS-REFERENCE TO RELATED APPLICATIONS

This patent application claims priority under 35 U.S.C. § 119 (a) of Korean Patent Application No. 10-2023-0151658, filed on Nov. 6, 2023, the entire disclosure of which is incorporated herein by reference.

TECHNICAL FIELD

Various embodiments of the present disclosure described herein relate to a memory system, and more particularly, to an apparatus and a method for reducing power consumption in the memory system.

BACKGROUND

A data processing system including a communication system, a memory system, or a data storage device is developed to store more data in a memory device and transfer data stored in the memory device more quickly. The memory device may include nonvolatile memory cells and/or volatile memory cells for storing data.

Various communication systems and data processing systems may present high requirements for complexity and performance of low-density parity-check (LDPC) decoders. A bit-flipping decoder may be suitable for such applications. Column layered scheduling may be a way to increase convergence speed and may improve error correction performance. Further, layered decoding may lead to improved decoding performance with low computational complexity in LDPC decoder implementations.

BRIEF DESCRIPTION OF THE DRAWINGS

The description herein makes reference to the accompanying drawings wherein like reference numerals refer to like parts throughout the figures.

FIG. 11 describes a configuration and design for a memory system according to another embodiment of the present disclosure.

DETAILED DESCRIPTION

Figure 1:
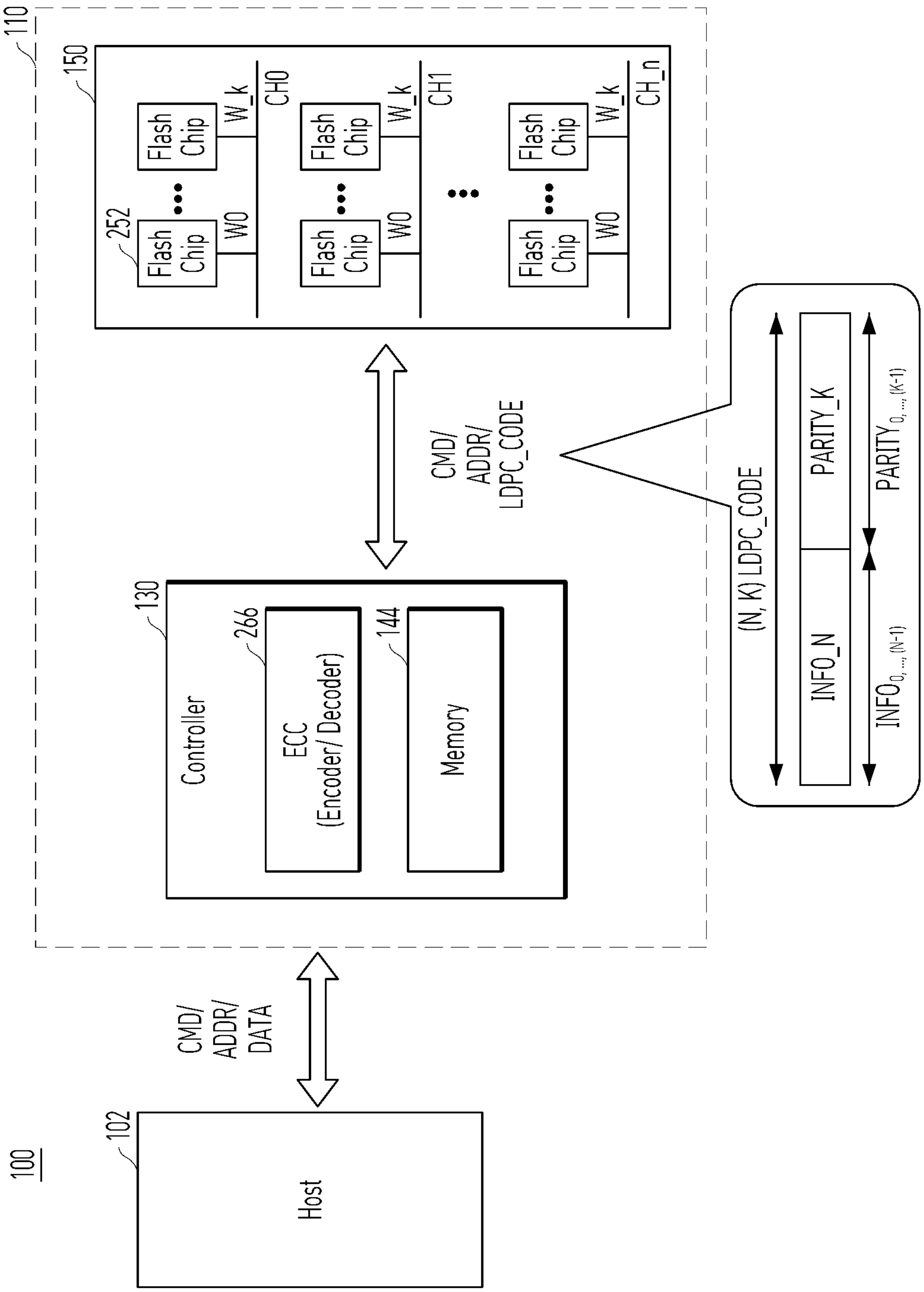
FIG. 1 describes a data processing system according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational e.g., is not turned on nor activated. The block/unit/circuit/component used with the "configured to" language include hardware for example, circuits, memory storing program instructions executable to implement the operation, etc. Additionally, "configured to" can include a generic structure e.g., generic circuitry, that is manipulated by software and/or firmware e.g., an FPGA or a general-purpose processor executing software to operate in a manner that is capable of performing the task(s) at issue. "Configured to" may also include adapting a manufacturing process e.g., a semiconductor fabrication facility, to fabricate devices e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present disclosure may provide a memory device, a memory system, a controller included in the memory system, a data processing system including the memory system or the memory device, or a communication system for transmitting data.

An embodiment of the present disclosure can provide a device and a method that can reduce a maximum power consumed by a bit flipping decoder which is configured to detect or correct an error included in a data entry transmitted from a communication system or memory system.

In an embodiment of the present disclosure, a memory system can include a memory device configured to output a codeword; and a controller configured to: establish, from the codeword, a plurality of variable nodes and a plurality of check nodes; and schedule a decoding operation to ensure that a number of check-sum updates during one cycle of the decoding operation does not exceed a threshold set to be less than a number of the check nodes, wherein the decoding operation includes iterative operations, and each iterative operation includes plural sub-iterative operations.

The controller can be configured to, when the number of checksum updates occurring during a first cycle exceeds the threshold, delay at least one sub-iterative operation for one or more check-sum updates exceeding the threshold to a next cycle of the first cycle.

In the memory system, a total number of the iterative operations and the sub-iterative operations can be changed by the checksum updates.

The controller can be configured to perform a thermal throttling based on a maximum power consumption preset in response to the threshold.

The controller can be further configured to change the threshold based on an operating state of the memory system.

The controller can include an operation circuitry configured to calculate or estimate whether a bit flipping occurs; a manager configured to determine whether to perform the bit flipping on a result calculated or estimated by the operation circuitry; a buffer configured to store a bit flipping target that is not applied according to a decision of the manager; a multiplexer configured to output one of outputs of the manager and the buffer; and a register configured to store the checksum updates in response to an output of the multiplexer.

The manager can be configured to determine whether to perform the bit flipping according to a first control signal corresponding to the threshold.

The multiplexer can output one of the outputs of the manager and the buffer according to a second control signal based on the scheduling.

The controller can further include a control logic configured to track whether the iterative operations and the sub-iterative operations are performed and output the first control signal and the second control signal based on the scheduling.

In another embodiment of the present disclosure, a method for decoding a codeword in a memory system can include establishing, from the codeword, a plurality of variable nodes and a plurality of check nodes; performing a flipping calculation for determining whether a bit flipping occurs against the plurality of variable nodes based on the plurality of check nodes during a decoding operation including iterative operations, each iterative operation including plural sub-iterative operations; determining a scheduling of whether check-sum updates occur based on the flipping calculation when a number of the check-sum updates during a first cycle of the decoding operation does not exceed a threshold set to be lower than a number of the check nodes; and performing the iterative operations and the sub-iterative operations based on the scheduling.

The method can further include, when the number of the check-sum updates during the one cycle exceeds the threshold, storing a part of the check-sum updates which exceeds the threshold; and determining a scheduling of whether stored check-sum updates occur in a next cycle of the first cycle.

A total number of the iterative operations and the sub-iterative operations can be changed by the checksum updates.

The method can further include performing a thermal throttling based on a maximum power consumption preset in response to the threshold.

The method can further include changing the threshold based on an operating state of the memory system.

In another embodiment of the present disclosure, a memory system can include a low-density parity-check (LDPC) decoder configured to perform a decoding operation based on a preset threshold, the decoding operation including at least one iterative operation, which includes at least one sub-iterative operation; and a control logic configured to determine the threshold based on an operating state of the memory system and determine scheduling regarding whether the iterative operation or the sub-iterative operation is performed at one cycle of the decoding operation by the LDPC decoder.

The memory system can further include a memory device configured to output a codeword. The control logic can be configured to: establish, from the codeword, a plurality of variable nodes and a plurality of check nodes; and schedule the decoding operation to ensure that a number of check-sum updates of the one cycle does not exceed a threshold set to be less than a number of the check nodes.

The control logic can be configured to, when the number of checksum updates occurring during a first cycle exceeds the threshold, delay at least one sub-iterative operation for one or more check-sum updates exceeding the threshold to a next cycle of the first cycle. A total number of the iterative operations and the sub-iterative operations can be changed by the checksum updates.

The control logic can be configured to perform a thermal throttling based on a maximum power consumption preset in response to the threshold.

The LDPC decoder can include an operation circuitry configured to calculate or estimate whether a bit flipping occurs; a manager configured to determine whether to perform the bit flipping on a result calculated or estimated by the operation circuitry; a buffer configured to store a bit flipping target that is not applied according to a decision of the manager; a multiplexer configured to output one of outputs of the manager and the buffer; and a register configured to store the checksum updates in response to an output of the multiplexer.

Embodiments will now be described with reference to the accompanying drawings, wherein like numbers reference like elements.

FIG. 1 describes a data processing system 100 according to an embodiment of the present disclosure.

Referring to FIG. 1, the data processing system 100 may include a host 102 engaged or coupled with a memory system 110. For example, the host 102 and the memory system 110 can be coupled to each other via a data bus, a host cable, and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input and output (input/output) operation (such as a read operation, a program operation, an erase operation, etc.) in response to a request or a command input from an external device such as the host 102. For example, when the controller 130 performs a read operation in response to a read request input from the external device, data stored in a plurality of non-volatile memory cells included in the memory device 150 is transferred to the controller 130. Further, the controller 130 can independently perform an operation regardless of the request or the command input from the host 102. Regarding an operation state of the memory device 150, the controller 130 can perform an operation such as garbage collection (GC), wear leveling (WL), a bad block management (BBM) for checking whether a memory block is bad and handling a bad block.

The memory device 150 can include plural memory chips 252 (e.g., NAND flash chips) coupled to the controller 130 through plural channels CH0, CH1, . . . , CH1_n and ways W0, . . . , W_k. The memory chip 252 can include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input/output operations are performed in parallel or simultaneously. According to an embodiment, memory blocks included in each memory plane or each memory die can be grouped to input/output plural data entries as a super memory block. An internal configuration of the memory device 150 shown in the above drawing may be changed based on operating performance of the memory system 110. An embodiment of the present disclosure may not be limited to the internal configuration described in FIG. 1.

The controller 130 can control a program operation or a read operation on the memory device 150 in response to a write request or a read request entered from the host 102. According to an embodiment, the controller 130 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the controller 130 may be implemented with a microprocessor, a central processing unit (CPU), an accelerator, or the like. According to an embodiment, the memory system 110 may be implemented with at least one multi-core processor, co-processors, or the like.

A memory 144 may serve as a working memory of the memory system 110 or the controller 130, while temporarily storing transactional data for operations performed in the memory system 110 and the controller 130. According to an embodiment, the memory 144 may be implemented with a volatile memory. For example, the memory 144 may be implemented with a static random access memory (SRAM), a dynamic random access memory (DRAM), or both. The memory 144 can be disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

According to an embodiment, the controller 130 may further include error correction code (ECC) circuitry 266 configured to perform error checking and correction of data transferred between the controller 130 and the memory device 150. The ECC circuitry 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

According to an embodiment, the ECC circuitry 266 can include an error correction code (ECC) encoder and an ECC decoder. The ECC encoder may perform error correction encoding on data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and output an instruction signal, e.g., a correction success signal or a correction fail signal, based on a result of the error correction decoding. The ECC circuitry 266 may use a parity bit, which has been generated during the ECC encoding process for the data stored in the memory device 150, in order to correct the error bits of the read data entries. When the number of the error bits is greater than or equal to the number of correctable error bits, the ECC circuitry 266 may not correct the error bits and instead may output the correction fail signal indicating failure in correcting the error bits.

According to an embodiment, the ECC circuitry 266 may perform an error correction operation based on a coded modulation such as a lowensity parity-check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The ECC circuitry 266 may include all circuits, modules, systems, and/or devices for performing the error correction operation based on at least one of the above-described codes.

According to an embodiment, the controller 130 and the memory device 150 may transmit and receive a command CMD, an address ADDR, or a codeword LDPC_CODE. For example, the codeword LDPC_CODE may be a codeword (N, K) LDPC_CODE including (N+K) bits or symbols. The codeword (N, K) LDPC_CODE may include an information word INFO_N and a parity PARITY_K. The information word INFO_N can include N bits or symbols $INFO_0, \ldots, INFO_{(N-1)}$, and the parity PARITY_K can include K bits or symbols $PARITY_0, \ldots, PARITY_{(K-1)}$. Here, N and K are natural numbers and may vary depending on a design of the LDPC code.

For example, if an input information word INFO_N including N bits or symbols $INFO_0, \ldots, INFO_{(N-1)}$ is LDPC-encoded, a codeword (N, K) LDPC_CODE can be generated. The codeword (N, K) LDPC_CODE may include (N+K) bits or symbols $LDPC\_CODE_0, \ldots, LDPC\_CODE_{(N+K)-1}$. The LDPC code can be a type of linear block code. A linear block code can be described by a generator matrix G or a parity check matrix H. As a feature of this LDPC code, most of the elements (e.g., entries) of the parity check matrix are made of zero (0), and the number of non-zero elements thereof is small as compared to a code length, so that iterative decoding based on probability could be possible. For instance, a first proposed LDPC code could be defined by a parity check matrix having a non-systematic form. The parity check matrix may be designed to have a uniformly low weight in its rows and columns. Here, a weight indicates the number of ones (1s) included in a column or row of the parity check matrix.

For example, regarding all codewords (N, K) LDPC_CODE, characteristics of a linear code may satisfy Equation 1 or Equation 2 shown below.

$$LDPC\_CODE \cdot H^T = 0 \qquad \text{(Equation 1)}$$

$$H \cdot LDPC\_CODE^T = [h_1 \;\; h_2 \;\; h_3 \;\; \ldots \;\; h_{(N+K)-1}] \cdot LDPC\_CODE^T = \sum_{i=0}^{(N+K)} LDPC\_COD_i \cdot h_i = 0 \qquad \text{(Equation 2)}$$

In Equations 1 and 2, H denotes a parity check matrix, LDPC_CODE denotes a codeword, LDPC_CODEi denotes the i-th bit of the codeword, and (N+K) denotes a length of the codeword. Also, hi indicates an i-th column of the parity check matrix H. The parity check matrix H may include (N+K) columns equal to the number of bits of the LDPC codeword. Equation 2 shows that the sum of the products of the i-th column hi of the parity check matrix H and the ith codeword bit LDPC_CODEi is '0', so the i-th column hi would be related to the i-th codeword bit LDPC_CODEi.

Figure 2:
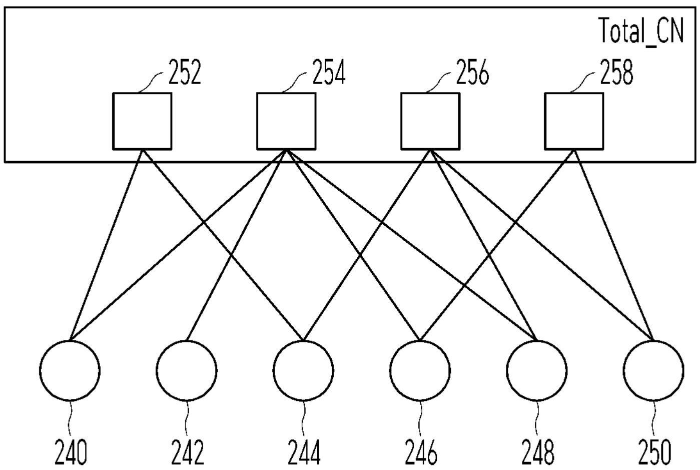
FIG. 2 describes a low-density parity-check (LDPC) code according to another embodiment of the present disclosure.

FIG. 2 describes an LDPC code according to another embodiment of the present disclosure.

FIG. 2 shows an example of a parity check matrix H of an LDPC code, which has 4 rows and 6 columns, and a Tanner graph thereof. Referring to FIG. 2, because the parity check matrix H has 6 columns, a codeword having a length of 6-bit can be generated. The codeword generated through H becomes an LDPC codeword, and each column of the parity check matrix H can correspond to each of 6 bits in the codeword.

The Tanner graph of the LDPC code encoded and decoded based on the parity check matrix H can include 6 variable nodes 240, 242, 244, 246, 248, 250 and 4 check nodes 252, 254, 256, 258. Here, the i-th column and the j-th row of the parity check matrix H of the LDPC code correspond to the i-th variable node and the j-th check node, respectively. In addition, a value of 1 at the intersection of the i-th column and the j-th row of the parity check matrix H of the LDPC code (i.e., the meaning of the value other than 0) means that there is an edge connecting the i-th variable node and the j-th check node on the Tanner graph as shown in FIG. 2.

The degree of the variable node and the check node in the Tanner graph of the LDPC code means the number of edges (i.e., lines) connected to each node. The number of edges could be equal to the number of non-zero entries (e.g., 1s) in a column or row corresponding to the node in the parity check matrix of the LDPC code. For example, in FIG. 2, degrees of the variable nodes 240, 242, 244, 246, 248, 250 are 2, 1, 2, 2, 2, 2, respectively. Degrees of the check nodes 252, 254, 256, 258 are 2, 4, 3, 2, respectively. In addition, the number of non-zero entries in each column of the parity check matrix H of FIG. 2, corresponding to the variable nodes of FIG. 2, can coincide with the above-mentioned orders 2, 1, 2, 2, 2, 2 in order. The number of non-zero entries in each row of the parity check matrix H of FIG. 2, corresponding to the check nodes of FIG. 2, can coincide with the aforementioned orders 2, 4, 3, 2 in order.

The LDPC code can be used for a decoding process using an iterative decoding algorithm based on a sum-product algorithm on a bipartite graph listed in FIG. 2. Here, the sum-product algorithm is a type of message passing algorithm. The message passing algorithm can include operations or processes for exchanging messages through an edge on the bipartite graph and calculating and updating an output message from the messages input to a variable node or a check node.

Herein, a value of the i-th coded bit may be determined based on a message of the i-th variable node. Depending on an embodiment, the value of the i-th coded bit can be obtained through both a hard decision and a soft decision. Therefore, performance of the i-th bit ci of the LDPC codeword can correspond to performance of the i-th variable node of the Tanner graph, which can be determined according to the positions of 1s and the number of 1s in the i-th column of the parity check matrix. Performance of (N+K) codeword bits of a codeword can be influenced by the positions of 1s and the number of 1s in the parity check matrix, which means that the parity check matrix can greatly affect performance of the LDPC code. Therefore, a method for designing a good parity check matrix would be required to design an LDPC code with excellent performance.

According to an embodiment, for ease of implementation, a quasi-cyclic LDPC (QC-LDPC) code using a QC parity check matrix may be used as a parity check matrix. The QC-LDPC code is characterized by having a parity check matrix including zero matrices having a form of a small square matrix or circulant permutation matrices. In this case, the permutation matrix may be a matrix in which all entries of the square matrix are 0 or 1, and each row or column includes only one 1. Further, the cyclic permutation matrix may be a matrix obtained by circularly shifting each of the entries of the permutation matrix from the left to the right.

Figure 3:
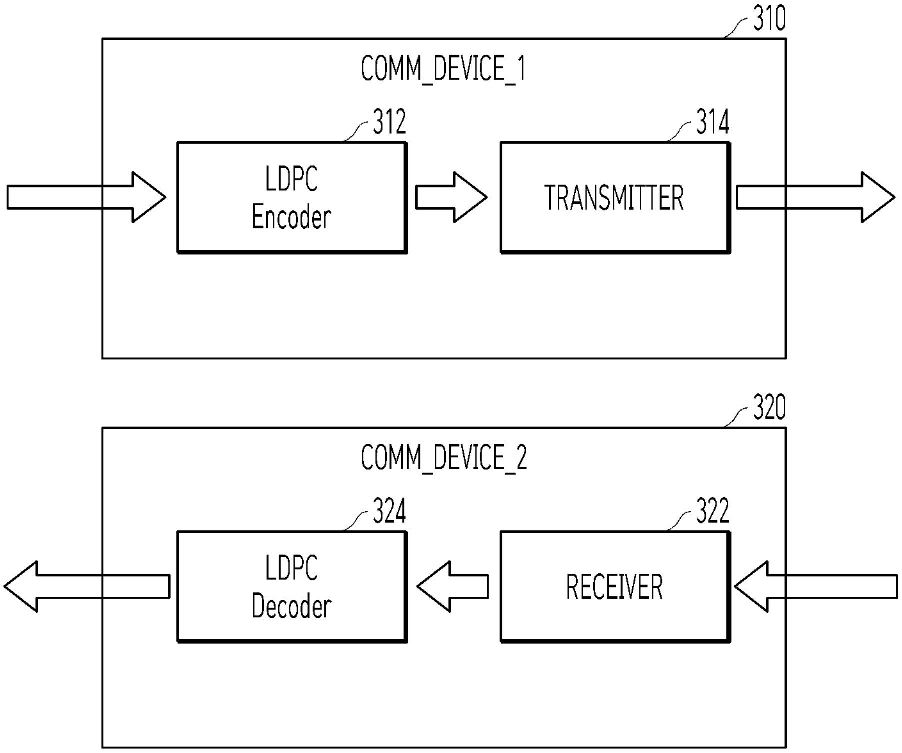
FIG. 3 describes a communication system according to another embodiment of the present disclosure.

FIG. 3 describes a communication system according to another embodiment of the present disclosure.

Referring to FIG. 3, the communication system may include but is not limited to a first communication device COMM_DEVICE_1 310 for transmitting signals or data or a second communication device COMM_DEVICE_2 320 for receiving signals or data. The first communication device 310 may include an LDPC encoder 312 and a transmitter 314. The second communication device 320 may include a receiver 322 and an LDPC decoder 324. Herein, the LDPC encoder 312 and the LDPC decoder 324 may encode or decode signals or data based on the LDPC code described in FIG. 2.

Referring to FIGS. 1 and 3, components used for encoding or decoding signals or data based on the LDPC code can be implemented within the memory system 110 including the controller 130, the communication system including the communication devices 310, 320, or the data processing system 100 including the memory system 110, based on an operation, a configuration, and performance thereof.

According to an embodiment, when a decoding process is performed using a sum-product algorithm (SPA), an LDPC code may provide performance close to capacity performance. For hard-decision decoding, a bit-flipping (BF) algorithm based on an LDPC code has been proposed. A BF algorithm can flip a bit, symbol, or group of bits (e.g., change '0' to '1', or vice versa) based on a value of a flipping function (FF) computed at each iteration or each iterative operation. The FF associated with the variable node (VN) could be a reliability metric of the corresponding bit decision and may depend on a binary value (checksum) of the check node (CN) connected to the VN. The BF algorithm could be simpler than the sum-product algorithm (SPA), but the simpleness can make a difference in performance. To reduce this performance difference, various types of BF algorithms have been proposed. The BF algorithm can be designed to improve the FF, which is the reliability metric of the VN, and/or the method of selecting bits, symbols, or groups of bits to be flipped, thereby providing various degrees of bit error rate (BER) in response to reduction or increment of complexity or improving convergence rate performance.

Figure 4:
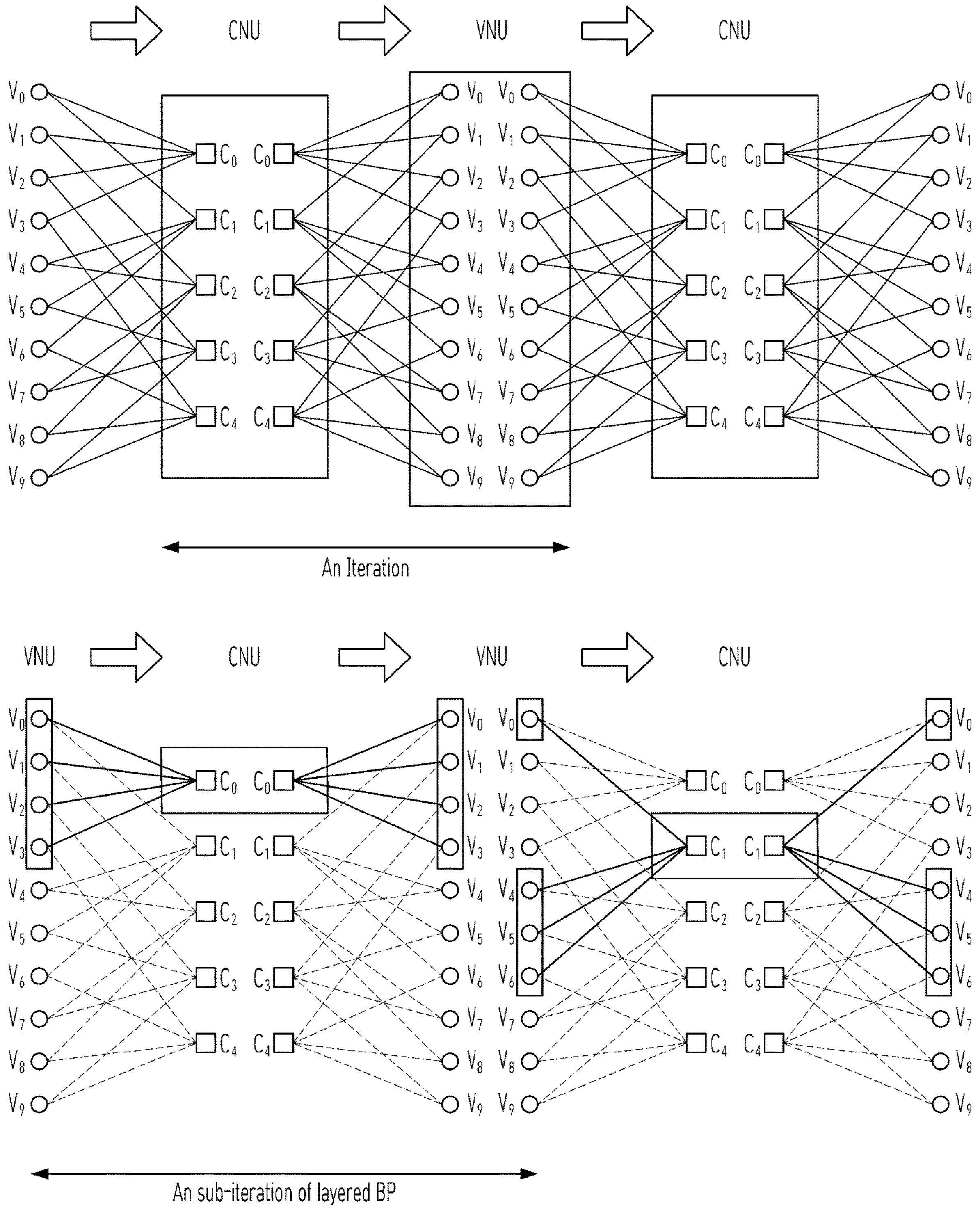
FIG. 4 describes an LDPC decoding operation according to another embodiment of the present disclosure.

FIG. 4 describes an LDPC decoding operation according to another embodiment of the present disclosure. FIG. 4 describes a layered belief propagation (LBP) algorithm for LDPC codes as an example.

Referring to FIGS. 1 to 4, the Low-Density Parity-Check (LDPC) codes could be a class of error correction codes widely used in digital communication and data storage systems based on error correction performance approaching capacity. The LDPC code uses a sparse parity check matrix, which results in an efficient decoding algorithm with good error correction. The layered belief propagation (LBP) algorithm, also known as "turbo-decoding" or "flooding", is an iterative decoding algorithm for LDPC codes. In each iteration, messages can be passed between variable nodes and check nodes on a bipartite graph representation of the LDPC code. These messages can represent probability distributions over possible bit values and be specified for each repetitive operation.

In the context of hierarchical layered belief propagation (LBP) algorithms for LDPC codes, the parity check matrix can be divided into several separate sub-matrices or "layers". Afterwards, a decoding process can proceed layer by layer. Within each layer, variable-check and check-variable message updates could be performed like standard BP. However, once a particular layer is processed, updated messages could be immediately used to process a next layer within a same global iteration. This layered belief propagation (LBP) algorithm can lead to faster convergence of the decoding algorithm compared to the standard BP, where all layers are updated simultaneously only once per global iteration. Thus, the hierarchical belief propagation (LBP) LDPC decoding can provide benefits such as reduced complexity and increased speed while maintaining improved error correction performance.

Referring to FIG. 4, a check node unit (CNU) and a variable node unit (VNU) may be established. Here, the check node unit (CNU) may include 5 check nodes $C_0$, $C_1$, $C_2$, $C_3$, $C_4$, and the variable node unit (VNU) may include 10 variable nodes $V_0$, $V_1$, $V_2$, $V_3$, $V_4$, $V_5$, $V_6$, $V_7$, $V_8$, $V_9$. Settings of the check node unit (CNU) and variable node unit (VNU) can be determined in the same manner as the LDPC code described in FIG. 2.

An upper diagram of FIG. 4 conceptually describes a single iteration among a plurality of iterations. The layered belief propagation (LBP) algorithm for LDPC codes may include various stages or levels of the decoding procedure, described as iterations and sub-iterations. The iteration may include completely going through all layers or groups of the parity check matrix of the LDPC code. In each iteration, messages could be passed between variable nodes and check nodes based on local observations and received messages. These iterations may continue until a stop or cessation condition is met, such as reaching a maximum number of iterations or achieving satisfactory error correction.

A lower diagram of FIG. 4 conceptually describes a single sub-iteration within the iteration. One iteration may include multiple sub-iterations. For example, the sub-iteration can be indicated by a solid line, and other sub-iterations can be indicated by a dotted line. While an iteration involves going through all layers of the LDPC code once, a sub-iteration may specifically involve an update process that occurs within each individual layer during the overall iteration. Sub-iterations may include intermediate steps within the iteration where message updates occur within individual layers of the LDPC decoding procedure based on the layered belief propagation (LBP) algorithm. The layered belief propagation decoding can be characterized by an operation that, instead of updating all check nodes simultaneously (corresponding to one full iteration) as in a traditional belief propagation (BP), the parity check matrix is split into several separate sub-matrices or layers and one layer is updated at a time.

According to an embodiment, each overall iteration may include multiple sub-iterations corresponding to each layer of the LDPC code structure. Here, each layer can be updated independently before moving on to the subsequent layer within the same global iteration. The advantage of this approach is that it can often lead to faster convergence compared to standard confidence propagation algorithms. This is because information updated in one layer can be immediately available when subsequent layers within the same overall iteration are processed.

Figure 5:
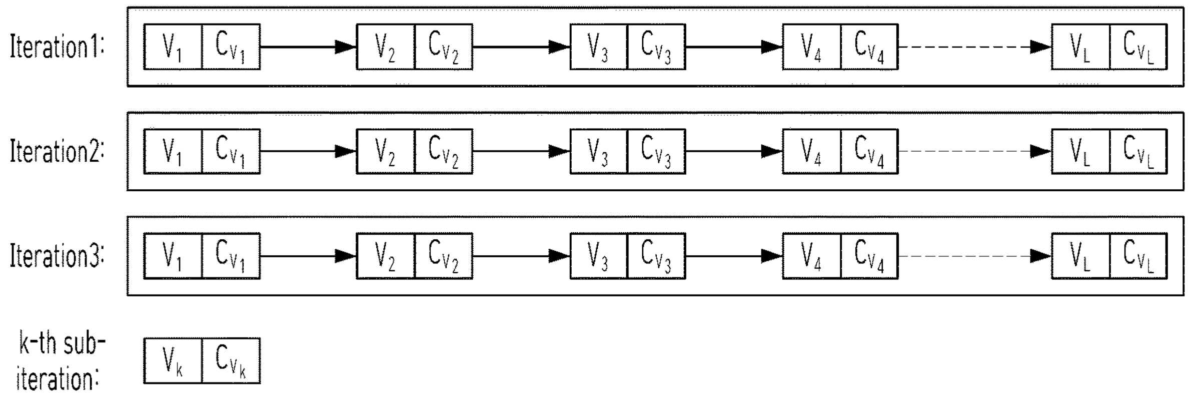
FIG. 5 describes an LDPC decoding operation according to another embodiment of the present disclosure.

FIG. 5 describes an LDPC decoding operation according to another embodiment of the present disclosure. Specifically, FIG. 5 describes the LDPC decoding procedure shown in FIGS. 1 to 4 by dividing the LDPC decoding procedure into iterations and sub-iterations.

Referring to FIGS. 4 and 5, each of a plurality of iterations (e.g., Iteration1, Iteration2, Iteration3) may include a plurality of sub-iteration operations ($V_k$&$Cv_k$). Here, k refers to a natural number between 1 and L. The numbers of variable nodes and check nodes can be established as described in FIGS. 2 and 4. A sub-iteration may include operations such as access to a variable node (VN) being repeated within one iteration, error correction, and flip confirmation. Specifically, $V_k$ refers to the kth subgroup of variable nodes (VN), and the variable nodes of all k can result in the entire set of variable nodes (VNs). $Cv_k$ may refer to a set of check nodes (CNs) that have connections to $V_k$.

Figure 12:
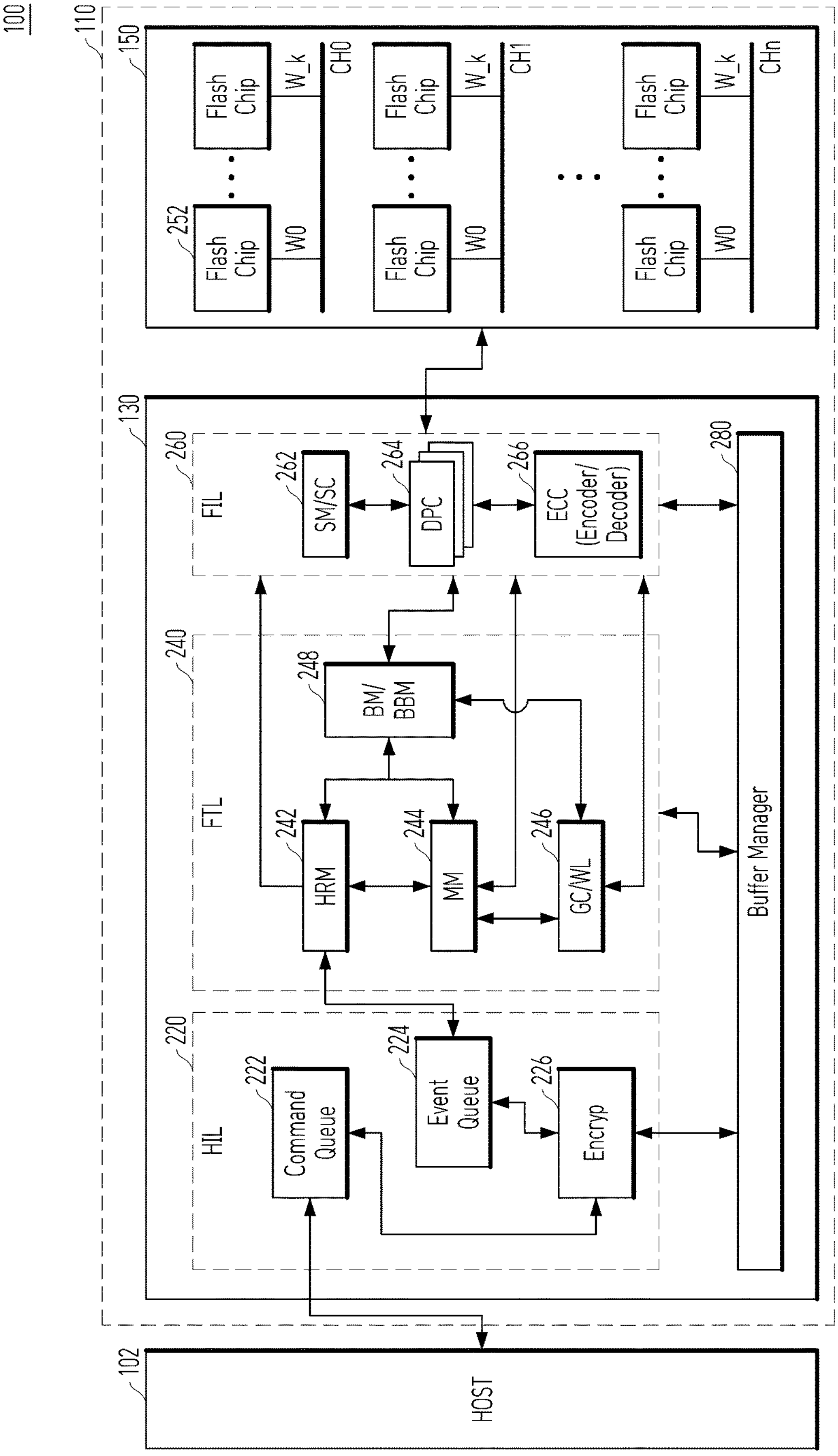
FIG. 12 describes a memory system according to another embodiment of the present disclosure.

The plurality of iterations (e.g., Iteration1, Iteration2, Iteration3) can be performed until a predetermined maximum number of iterations is reached or a stop condition is met depending on performance of the LDPC decoder (e.g., the ECC circuitry 266 shown in FIGS. 1 and 12). Each of the plurality of iteration operations (Iteration1, Iteration2, Iteration3) can include a plurality of sub-iterations ($V_1$&$Cv_1$, $V_2$&$Cv_2$, $V_3$&$Cv_3$, $V_4$&$Cv_4$, . . . , $V_L$&$Cv_L$). The plurality of sub-iterations can be performed sequentially in response to configuration of variable nodes and check nodes. The LDPC decoder can update (e.g., bit flip, error correction) the information in $V_k$ by referring to $Cv_k$, and accordingly, the value inversion (e.g., Satisfied: 0, Unsatisfied: 1) may occur in $Cv_k$.

Figure 6:
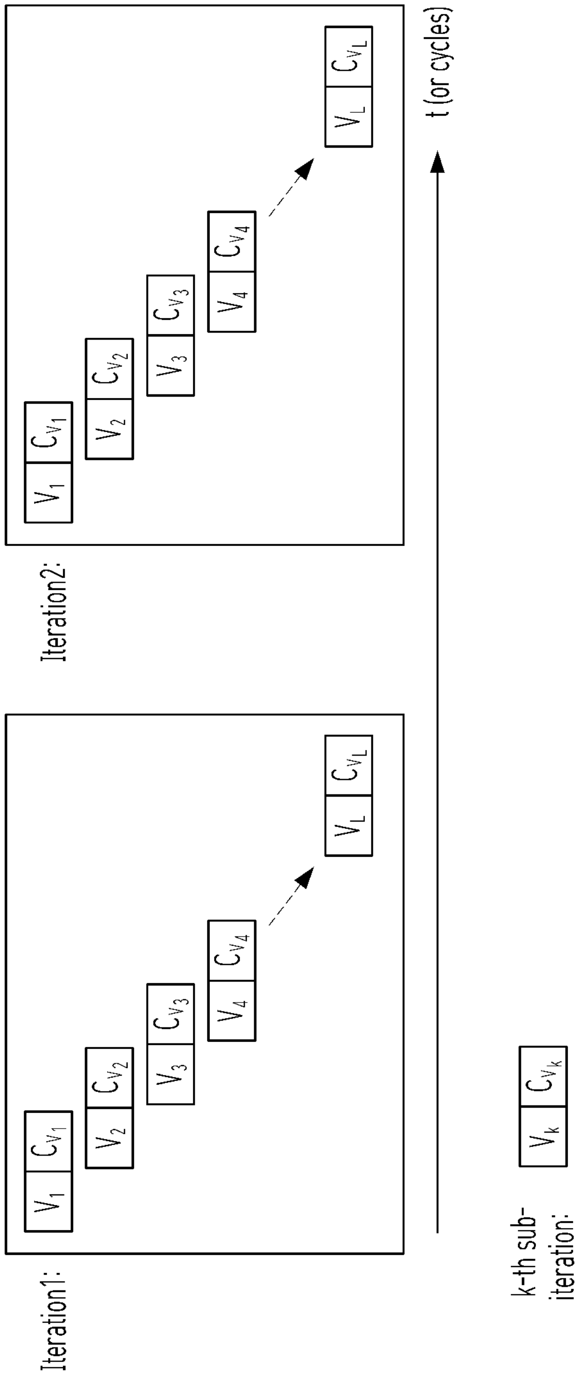
FIG. 6 describes an LDPC decoding operation according to another embodiment of the present disclosure.

FIG. 6 describes an LDPC decoding operation according to another embodiment of the present disclosure. While FIG. 5 describes an embodiment in which an iteration and a sub-iteration are performed sequentially, FIG. 6 shows an embodiment in which sub-iterations within each iteration are performed in a pipeline method.

Referring to FIG. 6, the decoding procedure can perform the plurality of iterations (Iteration1, Iteration2, Iteration3) or the plurality of sub-iterations ($V_1$&$Cv_1$, $V_2$&$Cv_2$, $V_3$&$Cv_3$, $V_4$&$Cv_4$, . . . , $V_L$&$Cv_L$) according to a passage of times (t) or a progress of cycles. The plurality of sub-iterations ($V_1$&$Cv_1$, $V_2$&$Cv_2$, $V_3$&$Cv_3$, $V_4$&$Cv_4$, . . . , $V_L$&$Cv_L$) included in the iteration might be not performed simultaneously, but could be performed in the pipeline method, thereby reducing times or cycles spent for completion of the iteration. Herein, the pipelined method or manner can include several independent processing stages (e.g., sub-iterations) connected in series, so that an output of a specific sub-iteration could be used for a next sub-iteration. This pipeline method is mainly effective in decomposing a complex decoding procedure into individual steps so that each step can be executed in parallel or independently.

By performing the plurality of sub-iterations ($V_1$&$Cv_1$, $V_2$&$Cv_2$, $V_3$&$Cv_3$, $V_4$&$Cv_4$, . . . , $V_L$&$Cv_L$) in the pipeline method, the time and cycles required for the decoding procedure could be reduced. However, the amount of calculation performed at a specific timing or in a specific cycle may increase. Additionally, a variation in (or a deviation between) the amounts of computation performed at specific timings or in specific cycles could increase. For these reasons, when designing an internal configuration of the memory system 110, a maximum consumption of power to be allocated to the LDPC decoder might increase, so that, under a low power environment or operating condition, operational safety or performance of the memory system 110 might deteriorate.

Figure 7:
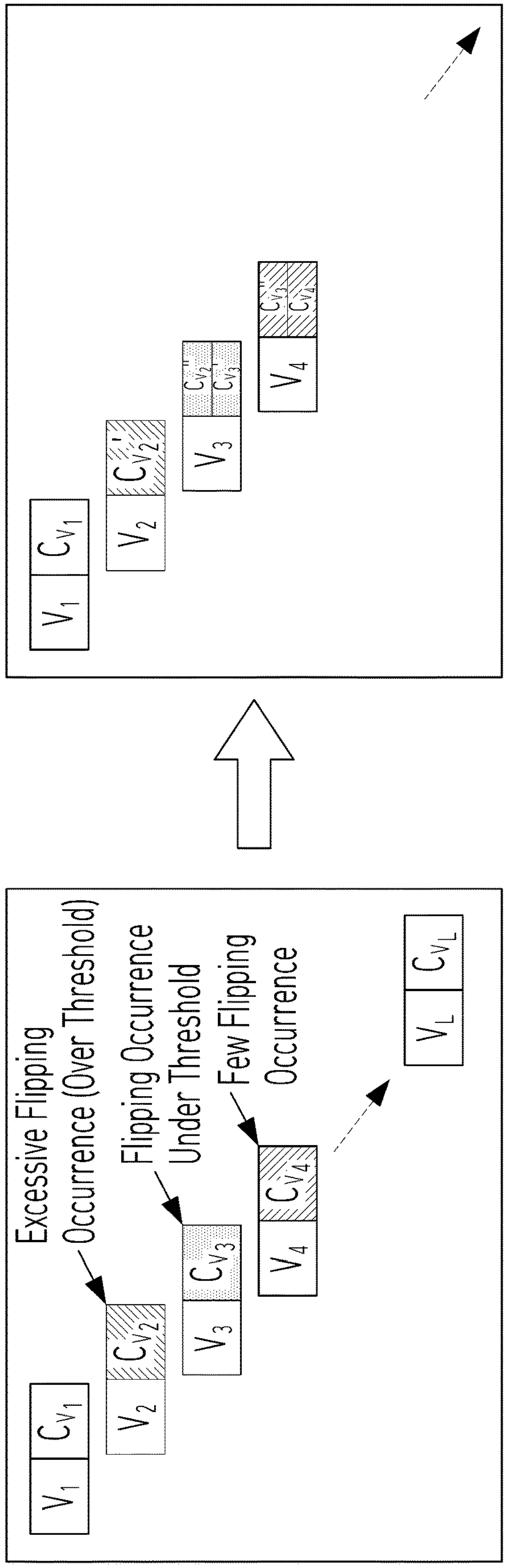
FIG. 7 describes an adjustment of LDPC decoding operations according to another embodiment of the present disclosure.

FIG. 7 describes an adjustment of LDPC decoding operations according to another embodiment of the present disclosure. FIG. 7 describes a decoding operation that delays at least some of the plurality of sub-iterations ($V_1$&$Cv_1$, $V_2$&$Cv_2$, $V_3$&$Cv_3$, $V_4$&$Cv_4$, . . . , $V_L$&$Cv_L$) included in the iteration (Iteration1, Iteration2, Iteration3).

Referring to FIG. 7, as described in FIG. 6, the plurality of sub-iterations ($V_1$&$Cv_1$, $V_2$&$Cv_2$, $V_3$&$Cv_3$, $V_4$&$Cv_4$, . . . , $V_L$&$Cv_L$) included in the iteration can be performed in the pipeline method. The LDPC decoder can have thresholds regarding the amount of calculation performed for sub-iterations in a particular cycle or at a particular timing. For example, in a second sub-iteration ($V_2$&$Cv_2$) within a specific iteration, excessive bit flips may occur so that the amount of calculation reaches the threshold (e.g., constraint exceeded). Moreover, the bit flip that occurs in a third sub-iteration ($V_3$&$Cv_3$) within the iteration might be less than the threshold. Additionally, bit flips that occur in a fourth sub-iteration ($V_4$&$Cv_4$) within the iteration may occur relatively very rarely. Although it may be difficult to predict in advance the number of bit flips that occur in each sub-iteration, the number of bit flips that occur in each sub-iteration may be greater or lesser than the threshold.

Because there is variation or deviation in/between the number of bit flips in sub-iterations performed at specific timings or in specific cycles, there might also be variation in power consumption due to the variation or deviation of the bit flips. Therefore, if a bit flip exceeding the threshold occurs in the second sub-iteration ($V_2$&$Cv_2$), a part of the second sub-iteration ($V_2$&$Cv_2$) could be delayed. Referring to FIG. 7, a part ($Cv_2$') of the second sub-iteration ($V_2$&$Cv_2$) may be performed in the originally performed cycle, and the remainder ($Cv_2$") of the second sub-iteration ($V_2$&$Cv_2$) may be performed in the next cycle.

Additionally, although the bit flip that occurs in the third sub-sub-iteration ($V_3$&$Cv_3$) may be less than the threshold, the remainder ($Cv_2$") of the second sub-iteration ($V_2$&$Cv_2$) may be performed at the time or cycle for the third sub-iteration ($V_3$&$Cv_3$). Thus, only a part ($Cv_3$') of the third sub-iteration ($V_3$&$Cv_3$) can be performed at that point or cycle. The remainder ($Cv_3$") of the third sub-iteration ($V_3$&$Cv_3$) could be performed in the next cycle.

If the bit flips that occur in the fourth sub-iteration ($V_4$&$Cv_4$) are relatively small, the remainder ($Cv_3$") of the third sub-iteration ($V_3$&$Cv_3$) and all ($Cv_4$) of the fourth sub-iteration ($V_4$&$Cv_4$) will be performed in that cycle.

Referring to FIGS. 4 to 7, in the layered belief propagation (LBP) algorithm, iterations and sub-iterations could be designed separately into a plurality of layers, and plural unit operations that could be distinguished from each other could be hierarchically scheduled. In particular, to reduce the amount of calculation for low-level iterations or unit operations that can be performed in each cycle to below a preset threshold, the LDPC decoder can delay some of calculation or operations included in low-level iterations or unit operations performed in a current cycle to a next cycle. According to an embodiment, if the lower-level calculation or operation are delayed in this way, a total amount of computation performed during the LDPC decoding operation might change (e.g., decrease).

Figure 8:
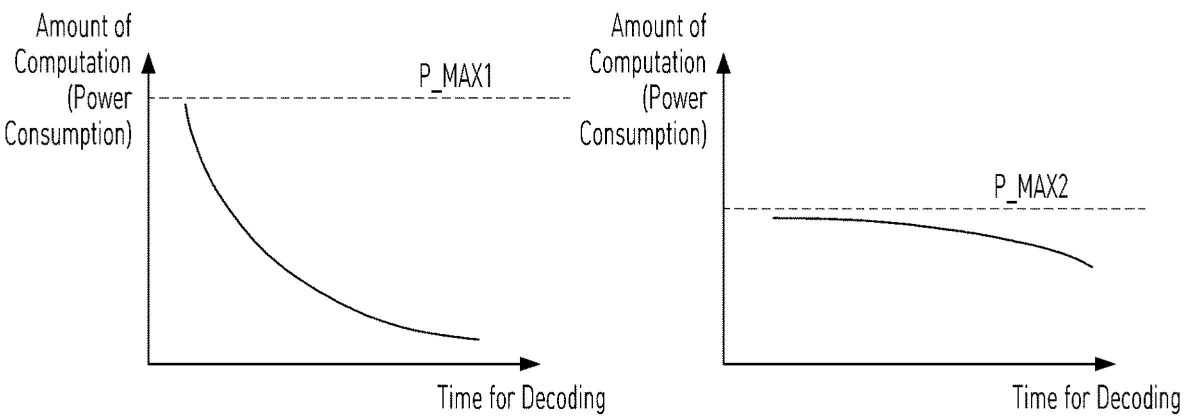
FIG. 8 describes an effect of LDPC decoding operations.

FIG. 8 describes an effect of LDPC decoding operations. The amount of computation performed in the LDPC decoder and the amount of power consumed therein are substantially proportional. FIG. 8 describes a relationship between a time required for the decoding procedure performed by the LDPC decoder and the amount of computation or power consumption.

Referring to FIG. 8, the amount of computation or power consumption for the decoding operation performed by the LDPC decoder could be reduced at a rate proportional to the amount, and the amount of computation or power consumption for the time to perform the decoding operation could be explained by an exponential decay in a two-dimensional graph. For example, during a process of checking and recovering errors for specific data due to the operation characteristics of LDPC decoding, any bit of the data may have an error at the beginning of the decoding operation, so many bit flips may occur at the beginning. However, as the decoding procedure progresses, the number of bits with a high probability of being error-free within the data can increase, which may reduce bit flips in a time or cycle. However, if specific data includes uncorrectable ECC (UECC) errors, bit flips might not decrease as the decoding operation progresses. Therefore, to increase the operational performance of LDPC decoding, the maximum number of bit flips that can be proportional to the number of check nodes and the degree of the check nodes can be set high. In response to these characteristics of the LDPC decoder, a first maximum power consumption threshold (P_MAX1) that can be used by the LDPC decoder may be set. For example, the first maximum power consumption threshold (P_MAX1) may be set to correspond to the time point or cycle at which bit flips occur the most due to operation characteristics of LDPC decoding. Herein, the first maximum power consumption threshold (P_MAX1) might be associated with thermal throttling of the LDPC decoder, the controller, or the memory system. The thermal throttling could be designed to cool and protect the LDPC decoder, the controller, or chips or components of the memory system in response to heavy workloads.

Referring to FIGS. 7 and 8, a threshold is set for computation or bit flips that occur during an iteration or a sub-iteration. If the number of bit flips exceeds the threshold, a corresponding operation (e.g., an iteration or a sub-iteration associated with at least one bit flip exceeding the threshold) could be delayed to a next time or cycle. In this case, the deviation between the numbers of bit flips may be reduced during each time or cycle during which the decoding procedure is performed. Additionally, a maximum power consumption that can be used by the LDPC decoder could be reduced, such as the second maximum power consumption threshold (P_MAX2) set in response to the threshold for the bit flips. For example, the second maximum power consumption threshold (P_MAX2) may be set in a range of 40 to 70% of the first maximum power consumption threshold (P_MAX1).

According to an embodiment, when a threshold for the bit flips is set, a decoding time may be longer (e.g., increase) compared to a case where the threshold regarding the bit flips is not set. However, due to the threshold, a maximum power consumed by the LDPC decoder could be lowered at a specific time or cycle during the decoding time. If the maximum power consumed by at least one module (e.g., LDPC decoder) included in the memory system 110 operating in a low-power environment could be reduced, the memory system 110 can have various advantages. These advantages will be described later with reference to FIG. 11.

Figure 9:
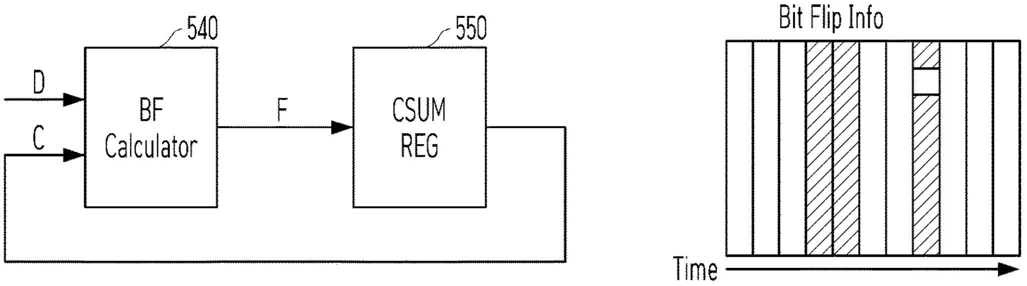
FIG. 9 describes an LDPC decoder according to another embodiment of the present disclosure.

FIG. 9 describes an LDPC decoder according to another embodiment of the present disclosure.

Referring to FIG. 9, the LDPC decoder can include bit flipping operation circuitry 540 and checksum register circuitry 550. The bit flipping operation circuitry 540 can be configured to receive data or a code word (D) and a feedback bit value (C) and output a flipping function value (F) based on the code word (D) and the feedback bit value (C). The checksum register circuitry 550 can be configured to store the flipping function value (F), determine whether to flip a bit in response to the flipping function value (F), and output the feedback bit value (C). The feedback bit value (C) output from the checksum register circuitry 550 may or may not be flipped.

Referring to bit flipping information (Bit Flip Info) of the LDPC decoder described in FIG. 9, as a decoding time passes, iterations or sub-iterations included in the iteration can be performed. For example, the bit flipping may occur in multiple sub-iterations (i.e., areas marked with a pattern) or may not occur in multiple sub-iterations (i.e., areas without a pattern). Referring to FIGS. 6 and 9, it is difficult to predict or estimate whether a bit flipping in the LDPC decoder occurs in a specific iteration or a specific sub-iteration. If the threshold is not set, a large deviation in whether bit flipping occurs in a cycle or at a timing of the decoding procedure could be estimated.

Figure 10:
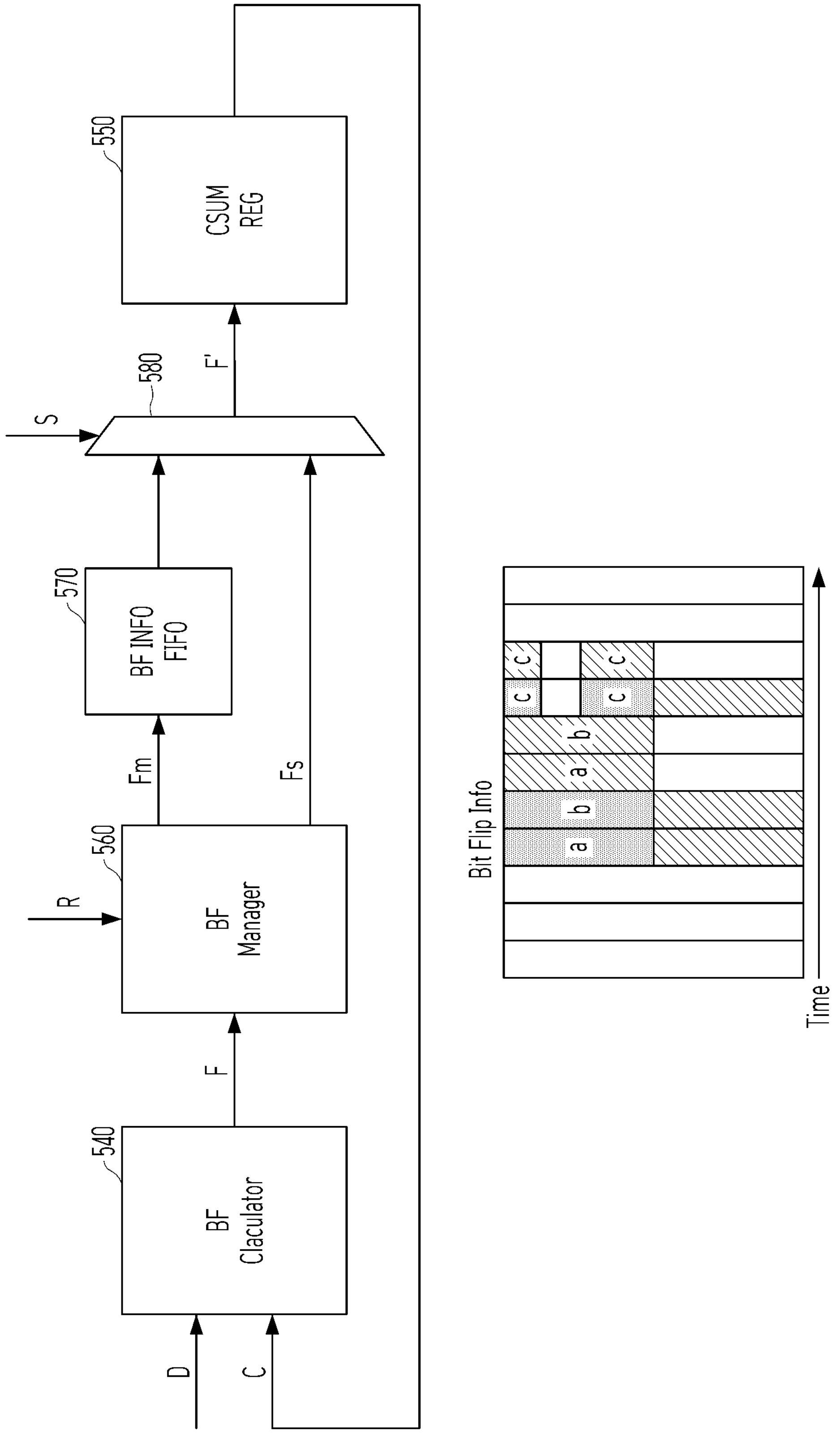
FIG. 10 describes an LDPC decoder according to another embodiment of the present disclosure.

FIG. 10 describes an LDPC decoder according to another embodiment of the present disclosure.

Referring to FIG. 10, the LDPC decoder can include the bit flipping operation circuitry 540 and the checksum register circuitry 550. Further, the LDPC decoder may further include a bit flipping (BF) manager 560, a queue 570, and a multiplexer 580 disposed between the bit flipping operation circuitry 540 and the checksum register circuitry 550.

The bit flipping operation circuitry 540 can be configured to receive data or a code word (D) and a feedback bit value (C) and output a flipping function value (F) based on the code word (D) and the feedback bit value (C).

After receiving the flipping function value (F) from the bit flipping operation circuitry 540, the bit flipping manager 560 may include circuitry, a logic, a circuit, a module, or an apparatus which can be configured to determine whether to apply the flipping function value (F) immediately or delay the flipping function value (F). The bit flipping manager 560 can receive a first control signal (R). At this time, the first control signal R may correspond to the threshold described in FIGS. 7 and 8. In response to the first control signal (R), the bit flipping manager 560 can be configured to distinguish or classify the flipping function value (F) received from the bit flipping operation circuitry 540 into an immediate processing bit flipping function value (Fs) and a delayed processing bit flipping function value (Fm).

The queue 570 can be configured to temporarily store the delayed processing bit flipping function value (Fm) delivered from the bit flipping manager 560. The queue 570 can output a stored function value first according to its designed characteristics (e.g., First In First Out (FIFO) method).

The multiplexer 580 can be configured to output, to the checksum register circuitry 550 as a flipping function value (F'), one of the delayed processing bit flipping function value (Fm) delivered from the queue 570 and the immediate processing bit flipping function value (Fs) output from the bit flipping manager 560. The multiplexer 580 may receive the second control signal(S). The second control signal S may be determined based on an iteration or a sub-iteration performed at a current timing or cycle during the decoding procedure and an iteration or a sub-iteration to be performed at a next timing or cycle.

The checksum register circuitry 550 can be configured to store the flipping function value (F') transmitted through the multiplexer 580 and determine whether to flip a bit in response to the stored flipping function value (F') to generate and output a feedback bit value (C). The feedback bit value (C) output from the checksum register circuitry 550 may or may not be flipped.

The bit flipping information (Bit Flip Info) of the LDPC decoder described in FIG. 10 can be determined based on a decoding operation for the same data or code word as the bit flipping information (Bit Flip Info) of the LDPC decoder described in FIG. 9. That is, if there is no bit flipping manager 560 that determines whether to apply the bit flipping function value (F) based on the first control signal (R) set corresponding to the threshold in FIG. 10, bit flipping (e.g., the area indicated by the pattern) which occurred in the iteration or the sub-iteration performed in each cycle of the decoding time (time) might be substantially the same.

However, referring to FIG. 10, when the threshold (e.g., about 50%) is set, ½ of the bit flipping that occurs in a specific cycle (a) is applied in that cycle, but the remaining ½ of the bit flipping can be applied later (e.g., in a next cycle from the cycle (a)). Likewise, ½ of the bit flipping that occurred in another cycle (b) is applied in that cycle, but the remaining ½ can be applied later (e.g., in a next cycle from the cycle (b)). Additionally, ½ of the bit flipping that occurred in another cycle (c) can be applied later (e.g., in a next cycle from the cycle (c)).

For convenience of description, it is taken as an example that the threshold is set to a certain ratio of the maximum estimated value of bit flipping that can occur. According to an embodiment, the threshold may be set to limit the number of check nodes on which the sub-iterations are performed. For example, referring to FIG. 4, the plurality of sub-iterations may be distinguished from each other based on the check nodes $C_0$, $C_1$, $C_2$, $C_3$, $C_4$ involved in each sub-iteration. If five check nodes are set and the number of sub-iterations performed in each cycle during the decoding operation is limited to three of five check nodes, the sub-iterations corresponding to the three check nodes only could be performed in each cycle without delay, and sub-iterations corresponding to the other two check nodes could be delayed and performed in a later cycle.

Referring to the bit flipping information (Bit Flip Info) of the LDPC decoder described in FIG. 10, as a decoding time passes, iterations and a plurality of sub-iterations included in the iteration are not all performed in a specific cycle. In each cycle, the number of sub-iterations occurring bit flipping updates below a threshold among the plurality of sub-iterations could be performed. Thus, bit flipping (area indicated by a pattern) that can occur through the sub-iterations would be distributed below a threshold for computation or bit flipping. Referring to FIGS. 7 and 8, a deviation in whether bit flipping occurs at timings or cycles of decoding time in the LDPC decoder could be reduced.

According to an embodiment, the LDPC decoder may include a control logic that is configured to track whether iterations and sub-iterations are performed, and output the first control signal R and the second control signal S for scheduling. Additionally, depending on the embodiment, the first control signal R may be replaced with a preset table value, etc.

According to an embodiment, the controller 130 described in FIG. 1 can be configured to check an operating state of the memory system 110 and adjust operating performance of the ECC circuitry 266 including the LDPC decoder. For example, depending on the operating state of the memory system 110, the controller 130 may set, change, or adjust a threshold for the LDPC decoder.

FIG. 11 describes configuration and design for a memory system according to another embodiment of the present disclosure. The memory system 110 described in FIG. 1 can include a plurality of components or a plurality of modules which can perform preset or assigned functions and roles, such as the memory system 110 or the controllers 130, 400 described in FIGS. 12 and 13. In FIG. 11, various embodiments of the memory system 110 are described based on a maximum allowable value for power consumption of a plurality of components (e.g., Module1, Decoder) within the memory system 110.

Referring to FIG. 11, a maximum allowable value for power consumption could be set or designed for each of the plurality of components (Module1, Decoder) included in the memory system 110. For example, a maximum allowable value for a first module (Module1) may be α, and a maximum allowable value of the LDPC decoder (Decoder) may be β. A maximum allowable value for the memory system 110 (e.g., total components included in the memory system 110) may be Ω.

As shown in FIGS. 7, 8, and 10, if the second maximum power consumption threshold (P_MAX2) is lowered by setting a threshold in the LDPC decoder, the maximum allowable value of the LDPC decoder could be lowered (β↓). In the first embodiment (Example 1), if the maximum allowable value for the memory system 110 is not changed (Ω) and the maximum allowable value of the LDPC decoder is lowered by the amount (β↓), the maximum allowable value of the first module (Module1) could be increased (α↑). In this case, operating performance of the first module (Module1) can be improved.

As shown in the N-th embodiment (Embodiment N), the maximum allowable value of the memory system 110 can be lowered (Ω↓) as the maximum allowable value of the LDPC decoder is lowered (β↓). In this case, the operational safety of the memory system 110 can be improved in a low-power environment.

As described above, because a plurality of components or a plurality of modules are included in the memory system 110, various designs for improving the performance of the memory system 110 could be possible when the maximum allowable value of the LDPC decoder is lowered (β↓).

FIG. 12 describes a data processing system 100 according to an embodiment of the present disclosure.

Referring to FIG. 12, the data processing system 100 may include a host 102 engaged or coupled with a memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way. According to an embodiment, the controller 130 coupled to the memory device 150 shown in FIG. 1 could correspond to controller 130, 400 shown in FIGS. 12 and 13. The controller 130, 400 shown in FIGS. 1, 12 and 13 could be implemented with a System-on-Chip (SoC).

The memory device 150 can include plural memory chips 252 (e.g., NAND flash chips) coupled to the controller 130 through plural channels CH0, CH1, . . . , CHn and ways W0, . . . , W_k. The memory chip 252 can include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input and output (input/output) operations are performed in parallel or simultaneously. According to an embodiment, memory blocks included in each memory plane or each memory die, which is included in the memory device 150, can be grouped to input/output plural data entries as a super memory block. An internal configuration of the memory device 150 shown in FIG. 12 may be changed based on operating performance of the memory system 110. An embodiment of the present disclosure may not be limited to the internal configuration described in FIG. 12.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input/output operation (such as a read operation, a program operation, an erase operation, etc.) in response to a request or a command input from an external device such as the host 102. For example, when the controller 130 performs a read operation in response to a read request input from an external device, data stored in a plurality of non-volatile memory cells included in the memory device 150 is transferred to the controller 130. Further, the controller 130 can independently perform an operation regardless of the request or the command input from the host 102. Regarding an operating state of the memory device 150, the controller 130 can perform an operation such as garbage collection (GC), wear leveling (WL), a bad block management (BBM) for checking whether a memory block is bad and handling a bad block.

Each memory chip 252 can include a plurality of memory blocks. The memory blocks may be understood to be a group of non-volatile memory cells in which data is removed together by a single erase operation. Although not illustrated, the memory block may include a page which is a group of non-volatile memory cells that store data together during a single program operation or output data together during a single read operation. For example, one memory block may include a plurality of pages. The memory device 150 may include a voltage supply circuit capable of supplying at least one voltage into the memory block. The voltage supply circuit may supply a read voltage Vrd, a program voltage Vprog, a pass voltage Vpass, or an erase voltage Vers into a non-volatile memory cell included in the memory block.

The host 102 interworking with the memory system 110, or the data processing system 110 including the memory system 110 and the host 102, may be a mobility electronic device (such as a vehicle), a portable electronic device (such as a mobile phone, an MP3 player, a laptop computer, or the like), and a non-portable electronic device (such as a desktop computer, a game machine, a TV, a projector, or the like). The host 102 may provide interaction between the host 102 and a user using the data processing system 100 or the memory system 110 through at least one operating system (OS). The host 102 transmits a plurality of commands corresponding to a user's request to the memory system 110, and the memory system 110 performs data input/output operations corresponding to the plurality of commands (e.g., operations corresponding to the user's request).

Referring to FIG. 12, the controller 130 in the memory system 110 operates along with the host 102 and the memory device 150. As illustrated, the controller 130 may have a layered structure including the host interface (HIL) 220, a flash translation layer (FTL) 240, and the memory interface layer or flash interface layer (FIL) 260.

The host interface layer (HIL) 220, the flash translation layer (FTL) 240, and the memory interface layer or flash interface layer (FIL) 260 included in the memory system 110 described in FIG. 12 are illustrated as one embodiment. The host interface layer (HIL) 220, the flash translation layer (FTL) 240, and the flash interface layer (FIL) 260 may be implemented in various forms according to the operating performance of the memory system 110. According to an embodiment, the host interface layer (HIL) 220, the flash translation layer (FTL) 240, and the flash interface layer (FIL) 260 can perform operations through multi cores or processors having a pipelined structure included in the controller 130.

The host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host 102 and the memory system 110 may be coupled to each other through a Universal Serial Bus (USB). The Universal Serial Bus (USB) is a highly scalable, hot-pluggable, plug-and-play serial interface that ensures cost-effective, standard connectivity to peripheral devices such as keyboards, a mouse, joysticks, printers, scanners, storage devices, modems, video conferencing cameras, and the like.

The memory system 110 may support the non-volatile memory express (NVMe). The non-volatile memory express (NVMe) is a type of interface based at least on a Peripheral Component Interconnect Express (PCIe) designed to increase performance and design flexibility of the host 102, servers, computing devices, and the like equipped with the memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred megabits per second (Mbps). According to an embodiment, the PCIe scheme may achieve bandwidths of tens to hundreds of gigabits per second (Gbps).

A buffer manager 280 in the controller 130 can control the input/output of data or operation information in conjunction with the host interface layer (HIL) 220, the flash translation layer (FTL) 240, and the memory interface layer or flash interface layer (FIL) 260. To this end, the buffer manager 280 can set or establish various buffers, caches, or queues in a memory, and control data input/output of the buffers, the caches, or the queues, or data transmission between the buffers, the caches, or the queues in response to a request or a command generated by the host interface layer (HIL) 220, the flash translation layer (FTL) 240, and the memory interface layer or flash interface layer (FIL) 260. For example, the controller 130 may temporarily store read data provided from the memory device 150 in response to a request from the host 102 before providing the read data to the host 102. Also, the controller 130 may temporarily store write data provided from the host 102 in a memory before storing the write data in the memory device 150. When controlling operations such as a read operation, a program operation, and an erase operation performed within the memory device 150, the read data or the write data transmitted or generated between the controller 130 and the memory device 150 in the memory system 110 could be stored and managed in a buffer, a queue, etc. of the memory established by the buffer manager 280. Besides the read data or the write data, the buffer manager 280 can store a signal or information (e.g., map data, a read command, a program command, or etc. which is used for performing operations such as programming and reading data between the host 102 and the memory device 150) in the buffer, the cache, the queue, etc. of the memory. The buffer manager 280 can set, or manage, a command queue, a program memory, a data memory, a write buffer/cache, a read buffer/cache, a data buffer/cache, a map buffer/cache, and etc.

The host interface layer (HIL) 220 may handle commands, data, and the like transmitted from the host 102. By way of example but not limitation, the host interface layer 220 may include a command queue manager 222 and an event queue manager 224. The command queue manager 222 may sequentially store the commands, the data, and the like received from the host 102 in a command queue, and output the stored commands and/or data to the event queue manager 224, for example, in an order in which the commands and/or data are stored in the command queue manager 222. The event queue manager 224 may sequentially transmit events for processing the commands, the data, and the like received from the command queue. According to an embodiment, the event queue manager 224 may classify, manage, or adjust the commands, the data, and the like received from the command queue. According to an embodiment, the host interface layer 220 can include an encryption manager (Encryp) 226 configured to encrypt a response or output data to be transmitted to the host 102 or to decrypt an encrypted portion in the command or data transmitted from the host 102.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or commands for reading data, i.e., a read command, and a command for programming/writing data, i.e., a write command, may be alternately transmitted to the memory system 110. The command queue manager 222 of the host interface layer 220 may sequentially store commands, data, and the like, which are transmitted from the host 102, in the command queue. Thereafter, the host interface layer 220 may estimate or predict what type of internal operations the controller 130 will perform according to the characteristics of the commands, the data, and the like, which have been transmitted from the host 102. The host interface layer 220 may determine a processing order and a priority of commands, data and the like based on their characteristics. According to the characteristics of the commands, the data, and the like transmitted from the host 102, the event queue manager 224 in the host interface layer 220 is configured to receive an event, which should be processed or handled internally within the memory system 110 or the controller 130 according to the commands, the data, and the like input from the host 102, from the buffer manager 280. Then, the event queue manager 224 can transfer the event including the commands, the data, and the like into the flash translation layer (FTL) 240.

According to an embodiment, the flash translation layer (FTL) 240 may include a host request manager (HRM) 242, a map manager (MM) 244, a state manager 246, and a block manager (BM/BBM) 248. According to an embodiment, the flash translation layer (FTL) 240 may implement a multi-thread scheme to perform data input/output (I/O) operations. A multi-thread FTL may be implemented through a multi-core processor using multi-thread included in the controller 130. For example, the host request manager (HRM) 242 may manage the events transmitted from the event queue. The map manager (MM) 244 may handle or control map data. The state manager 246 may perform an operation such as garbage collection (GC) or wear leveling (WL), after checking an operating state of the memory device 150. The block manager 248 may execute commands or instructions onto a block in the memory device 150.

The host request manager (HRM) 242 may use the map manager (MM) 244 and the block manager 248 to handle or process requests according to read and program commands and events which are delivered from the host interface layer 220. The host request manager (HRM) 242 may send an inquiry request to the map manager (MM) 244 to determine a physical address corresponding to a logical address which is entered with the events. The host request manager (HRM) 242 may send a read request with the physical address to the memory interface layer 260 to process the read request, i.e., handle the events. In one embodiment, the host request manager (HRM) 242 may send, to the block manager 248, a program request (or a write request) to program data to a specific empty page storing no data in the memory device 150, and then may transmit, to the map manager (MM) 244, a map update request corresponding to the program request to update an item relevant to the programmed data in information of mapping the logical and physical addresses to each other.

The block manager 248 may convert a program request delivered from the host request manager (HRM) 242, the map manager (MM) 244, and/or the state manager 246 into a flash program request used for the memory device 150, to manage flash blocks in the memory device 150. To maximize or enhance program or write performance of the memory system 110, the block manager 248 may collect program requests and send flash program requests for multiple-plane and one-shot program operations to the memory interface layer 260. In an embodiment, the block manager 248 sends several flash program requests to the memory interface layer 260 to enhance or maximize parallel processing of a multi-channel and multi-directional flash controller.

In an embodiment, the block manager 248 may manage blocks in the memory device 150 according to the number of valid pages, select and erase blocks having no valid pages when a free block is needed, and select a block including the least number of valid pages when it is determined that garbage collection is to be performed. The state manager 246 may perform garbage collection to move valid data stored in the selected block to an empty block and erase data stored in the selected block so that the memory device 150 may have enough free blocks (i.e., empty blocks with no data).

When the block manager 248 provides information regarding a block to be erased to the state manager 246, the state manager 246 may check all flash pages of the block to be erased to determine whether each page of the block is valid. For example, to determine validity of each page, the state manager 246 may identify a logical address recorded in an out-of-band (OOB) area of each page of the memory device 150. To determine whether each page is valid, the state manager 246 may compare a physical address of the page with a physical address mapped to a logical address obtained from an inquiry request. The state manager 246 sends a program request to the block manager 248 for each valid page. A map table may be updated by the map manager 244 when a program operation is complete.

The map manager 244 may manage map data, e.g., a logical-physical map table. The map manager 244 may process various requests, for example, queries, updates, and the like, which are generated by the host request manager (HRM) 242 or the state manager 246. The map manager 244 may store the entire map table in the memory device 150, e.g., a flash/non-volatile memory, and cache mapping entries according to the storage capacity of the memory 144. When a map cache miss occurs while processing inquiry or update requests, the map manager 244 may send a read request to the memory interface layer 260 to load a relevant map table stored in the memory device 150. When the number of dirty cache blocks in the map manager 244 exceeds a certain threshold value, a program request may be sent to the block manager 246, so that a clean cache block is made and a dirty map table may be stored in the memory device 150.

When garbage collection is performed, the state manager 246 copies valid page(s) into a free block, and the host request manager (HRM) 242 may program the latest version of the data for the same logical address of the page and concurrently issue an update request. When the state manager 246 requests the map update in a state in which the copying of the valid page(s) is not completed normally, the map manager 244 may not perform the map table update. This is because the map request is issued with old physical information when the state manger 246 requests a map update and a valid page copy is completed later. The map manager 244 may perform a map update operation to ensure accuracy when, or only if, the latest map table still points to the old physical address.

The memory interface layer or flash interface layer (FIL) 260 may exchange data, commands, state information, and the like, with the plurality of memory chips 252 in the memory device 150 through a data communication method. According to an embodiment, the memory interface layer 260 may include a status check schedule manager (SM/SC) 262 and a data path manager (DPC) 264. The status check schedule manager 262 can check and determine the operating state regarding the plurality of memory chips 252 coupled to the controller 130. The operating state may represent a state regarding a plurality of channels CH0, CH1, . . . , CHn and the plurality of ways W0, . . . , W_k, and the like. The transmission and reception of data or commands can be scheduled in response to the operating states regarding the plurality of memory chips 252 and the plurality of channels CH0, CH1, . . . , CHn. The data path manager 264 can control the transmission and reception of data, commands, etc. through the plurality of channels CH0, CH1, . . . , CHn and ways W0, . . . , W_k based on the information transmitted from the status check schedule manager 262. According to an embodiment, the data path manager 264 may include a plurality of transceivers, each transceiver corresponding to each of the plurality of channels CH0, CH1, . . . , CHn. Further, according to an embodiment, the status check schedule manager 262 and the data path manager 264 included in the memory interface layer 260 could be implemented as, or engaged with, a memory control sequence generator.

According to an embodiment, the memory interface layer 260 may further include error correction code (ECC) circuitry 266 configured to perform error checking and correction of data transferred between the controller 130 and the memory device 150. The ECC circuitry 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

For finding and correcting any error of data transferred from the memory device 150, the ECC circuitry 266 can include an error correction code (ECC) encoder and an ECC decoder. The ECC encoder may perform error correction encoding on data to be programmed in the memory device 150 to generate encoded data into which a parity bit is added and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and outputs an instruction signal, e.g., a correction success signal or a correction fail signal, based on a result of the error correction decoding. The ECC circuitry 266 may use a parity bit, which has been generated during the ECC encoding process for the data stored in the memory device 150, to correct the error bits of the read data entries. When the number of the error bits is greater than or equal to the number of correctable error bits, the ECC circuitry 266 may not correct the error bits and instead may output the correction fail signal indicating failure in correcting the error bits.

According to an embodiment, the ECC circuitry 266 may perform an error correction operation based on a coded modulation such as a low-density parity-check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The ECC circuitry 266 may include all circuits, modules, systems, and/or devices for performing the error correction operation based on at least one of the above-described codes.

For example, the encoder in the ECC circuitry 266 may generate a codeword that is a unit of ECC-applied data. A codeword of length n bits may include k bits of user data and (n-k) bits of parity. A code rate may be calculated as (k/n). The higher the code rate, the more user data that can be stored in a given codeword. When the length of the codeword is longer and the code rate is smaller, the error correction capability of the ECC circuitry 266 could be improved. In addition, the ECC circuitry 266 performs decoding using information read from the channels CH0, CH1, . . . , CHn. The decoder in the ECC circuitry 266 can be classified into a hard decision decoder and a soft decision decoder according to how many bits represent the information to be decoded. A hard decision decoder performs decoding with a memory cell output information expressed in 1 bit, and the 1-bit information used at this time is called hard decision information. A soft decision decoder uses more accurate memory cell output information composed of 2 bits or more, and this information is called soft decision information. The ECC circuitry 266 may correct errors included in data using the hard decision information or the soft decision information.

According to an embodiment, to increase the error correction capability, the ECC circuitry 266 may use a concatenated code using two or more codes. In addition, the ECC circuitry 266 may use a product code that divides one codeword into several rows and columns and applies a different relatively short ECC to each row and column.

In accordance with an embodiment, a manager included in the host interface layer 220, the flash translation layer (FTL) 240, and the memory interface layer or flash interface layer (FIL) 260 could be implemented with a general processor, an accelerator, a dedicated processor, a co-processor, a multi-core processor, or the like. According to an embodiment, the manager can be implemented with firmware working with a processor.

According to an embodiment, the memory device 150 is embodied as a non-volatile memory such as a flash memory, for example, a Read Only Memory (ROM), a Mask ROM (MROM), a Programmable ROM (PROM), an Erasable ROM (EPROM), an Electrically Erasable ROM (EEPROM), a Magnetic (MRAM), a NAND flash memory, a NOR flash memory, or the like. In another embodiment, the memory device 150 may be implemented by at least one of a phase change random access memory (PCRAM), a Resistive Random Access Memory (ReRAM), a ferroelectrics random access memory (FRAM), a spin transfer torque random access memory (STT-RAM), and a spin transfer torque magnetic random access memory (STT-MRAM), or the like.

Figure 13:
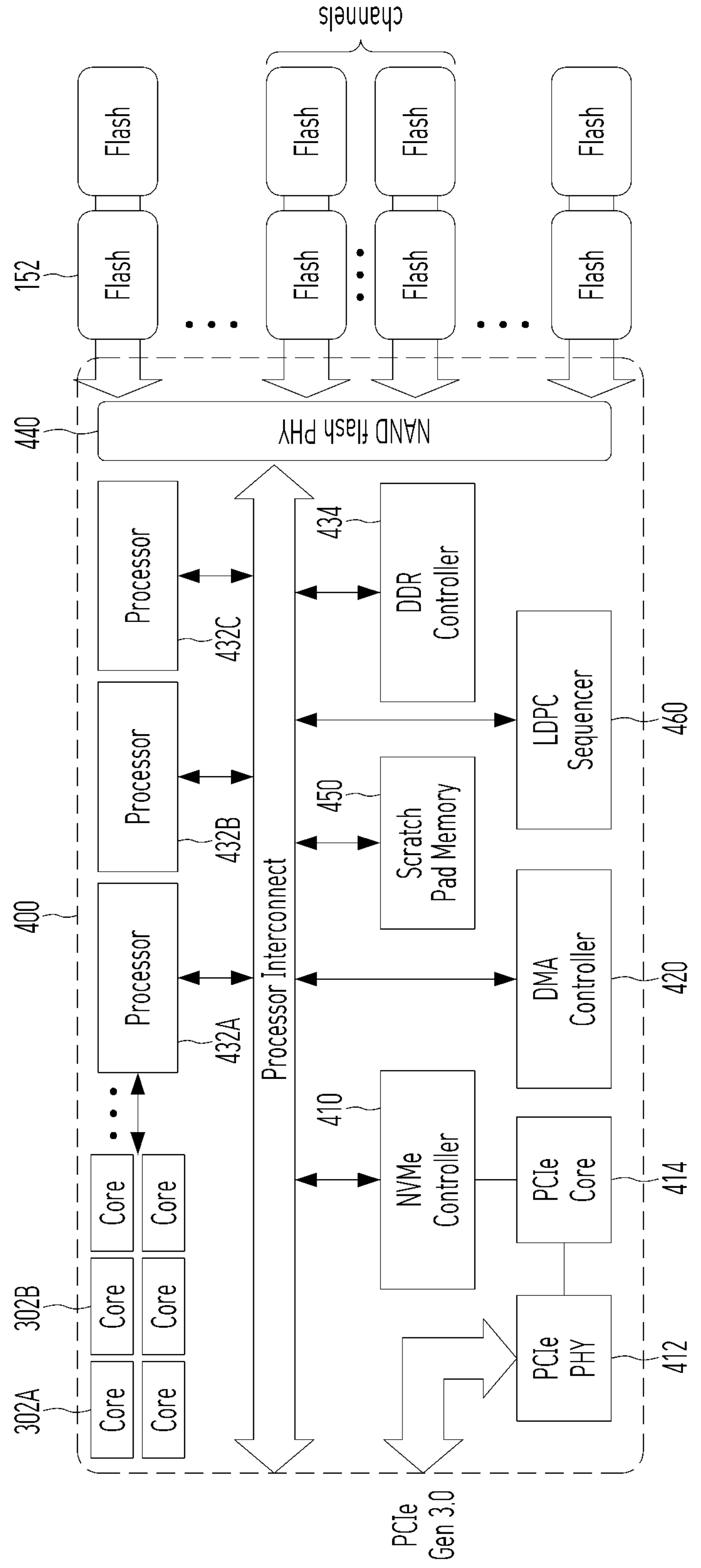
FIG. 13 describes a memory system according to another embodiment of the present disclosure.

FIG. 13 describes a data storage system according to an embodiment of the present disclosure. FIG. 13 shows a memory system including multiple cores or multiple processors, which is an example of a data storage system. The memory system may support the Non-Volatile Memory Express (NVMe) protocol.

The NVMe is a type of transfer protocol designed for a solid-state memory that could operate much faster than a conventional hard drive. The NVMe can support higher input/output operations per second (IOPS) and lower latency, resulting in faster data transfer speeds and improved overall performance of the data storage system. Unlike SATA which has been designed for a hard drive, the NVMe can leverage the parallelism of solid-state storage to enable more efficient use of multiple queues and processors (e.g., CPUs). The NVMe is designed to allow hosts to use many threads to achieve higher bandwidth. The NVMe can allow the full level of parallelism offered by SSDs to be fully exploited. However, because of limited firmware scalability, limited computational power, and high hardware contention within SSDs, the memory system might not process a large number of I/O requests in parallel.

Referring to FIG. 13, the host, which is an external device, can be coupled to the memory system through a plurality of PCIe Gen 3.0 lanes, a PCIe physical (PHY) layer 412, and a PCIe core 414. A controller 400 may include three embedded processors 432A, 432B, 432C, each using two cores 302A, 302B. According to an embodiment, the plurality of cores 302A, 302B or the plurality of embedded processors 432A, 432B, 432C can be implemented with a tensor processing unit (TPU).

The plurality of embedded processors 432A, 432B, 432C may be coupled to an internal DRAM (e.g., DDR) controller 434 through a processor interconnect. The controller 400 further includes a low-density parity-check (LDPC) sequencer 460, a direct memory access (DMA) engine or controller 420, a scratch pad memory 450 for metadata management, and an NVMe controller 410. Components within the controller 400 may be coupled to a plurality of channels connected to a plurality of memory packages (e.g., NAND flash) 152 through a flash physical (PHY) layer (e.g., NAND flash physical layer) 440. The plurality of memory packages 152 may correspond to the plurality of memory chips 252 described in FIG. 12.

According to an embodiment, the NVMe controller 410 included in the controller 400 is a type of storage controller designed for use with solid state drives (SSDs) that use an NVMe interface. The NVMe controller 410 may manage data transfer between the SSD and the computer CPU (e.g., the host 102 shown in FIG. 12) as well as other functions such as error correction, wear leveling, and power management. The NVMe controller 410 may use a simplified, low-overhead protocol to support fast data transfer rates.

According to an embodiment, the scratch pad memory 450 may be a storage area set by the NVMe controller 410 to temporarily store data. The scratch pad memory 450 may be used to store data waiting to be written to a plurality of memory packages 152. The scratch pad memory 450 can also be used as a buffer to speed up the writing process, typically with a small amount of Dynamic Random Access Memory (DRAM) or Static Random Access Memory (SRAM). When a write command is executed, data may first be written to the scratch pad memory 450 and then transferred to the plurality of memory packages 152 in larger blocks. The scratch pad memory 450 may be used as a temporary memory buffer to help optimize the write performance of the plurality of memory packages 152. The scratch pad memory 450 may serve as intermediate storage of data before the data is written to non-volatile memory cells.

The Direct Memory Access (DMA) controller 420 included in the controller 400 is a component that transfers data between the NVMe controller 410 and a host memory in a host without involving a host's processor. The DMA engine 420 can support the NVMe controller 410 to directly read or write data from or to the host memory without intervention of the host's processor. According to an embodiment, the DMA controller 420 may achieve or support high-speed data transfer between a host and an NVMe device, using a DMA descriptor that includes information regarding data transfer such as a buffer address, a transfer length, and other control information.

The low-density parity-check (LDPC) sequencer 460 in the controller 400 is a component that performs error correction on data stored in the plurality of memory packages 152. Herein, an LDPC code is a type of error correction code commonly used in a NAND flash memory to reduce a bit error rate. The LDPC sequencer 460 may be designed to immediately process encoding and decoding of LDPC codes when reading and writing data from and to the NAND flash memory. According to an embodiment, the LDPC sequencer 460 may divide data into plural blocks, encode each block using an LDPC code, and store the encoded data in the plurality of memory packages 152. Thereafter, when reading the encoded data from the plurality of memory packages 152, the LDPC sequencer 460 can decode the encoded data based on the LDPC code and correct errors that may have occurred during a write or read operation. The LDPC sequencer 460 may correspond to the ECC circuitry 266 described in FIG. 12.

In addition, although FIGS. 12 and 13 illustrate an example of a memory system including the memory device 150 or the plurality of memory packages 152 capable of storing data, the data storage system according to an embodiment of the present disclosure may not be limited to the memory system described in FIGS. 12 and 13. For example, the memory device 150, the plurality of memory packages 152, or the data storage device controlled by the controllers 130, 400 may include volatile or non-volatile memory devices. In FIG. 13, it is described that the controller 400 can perform data communication with the host externally placed from the memory system (see FIG. 12) through an NVM Express (NVMe) interface and a PCI Express (PCIe). In an embodiment, the controller 400 may perform data communication with at least one host through a protocol such as a Compute Express Link (CXL).

Additionally, according to an embodiment, an apparatus and method for performing distributed processing or allocation/reallocation of the plurality of instructions in a controller including multi processors of the pipelined structure according to an embodiment of the present disclosure can be applicable to a data processing system including a plurality of memory systems or a plurality of data storage devices. For example, a Memory Pool System (MPS) is a very general, adaptable, flexible, reliable and efficient memory management system where a memory pool such as a logical partition of primary memory or storage reserved for processing a task or group of tasks could be used to control or manage a storage device coupled to the controller. The controller including multi processors in the pipelined structure can control data and program transfer to the memory pool controlled or managed by the memory pool system (MPS).

As described above, operation safety of a controller or a memory system could be improved or enhanced by reducing power consumed to check and correct errors included in data transmitted from a memory device of a memory system according to an embodiment of the present disclosure.

In addition, data input/output performance (e.g., I/O throughput) of the memory system can be improved by reducing the power consumption of the controller within the memory system or providing an efficient or effective way for power distribution or power consumption in the controller or the memory system.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory system, comprising:

a memory device configured to output a codeword; and a controller configured to perform a decoding operation, which comprises iterative operations, each iterative operation comprising plural sub-iterative operations, by:

establish, from the codeword, a plurality of variable nodes and a plurality of check nodes; and check a number of check-sum updates during a single cycle of the decoding operation;

compare the number of check-sum updates with a threshold set to be less than a number of the check nodes;

perform or delay at least some part of the decoding operation to ensure that the number of check-sum updates does not exceed the threshold based on a comparison result, wherein the controller comprises:

an operation circuitry configured to calculate or estimate whether a bit flipping occurs;

a manager configured to determine whether to perform the bit flipping on a result calculated or estimated by the operation circuitry;

a buffer configured to store a bit flipping target that is not applied according to a decision of the manager;

a multiplexer configured to output one of outputs of the manager and the buffer; and a register configured to store the check-sum updates in response to an output of the multiplexer.

2. The memory system according to claim 1, wherein the controller is configured to, when the number of check-sum updates occurring during a first cycle exceeds the threshold, delay at least one sub-iterative operation associated with one or more check-sum updates exceeding the threshold to a next cycle of the first cycle.

3. The memory system according to claim 2, wherein a total number of the iterative operations and the sub-iterative operations is changed by the check-sum updates.

4. The memory system according to claim 1, wherein the controller is configured to perform a thermal throttling based on a maximum power consumption preset in response to the threshold.

5. The memory system according to claim 1, wherein the controller is further configured to change the threshold based on an operating state of the memory system.

6. The memory system according to claim 1, wherein the manager is configured to determine whether to perform the bit flipping according to a first control signal corresponding to the threshold.

7. The memory system according to claim 6, wherein the multiplexer outputs one of the outputs of the manager and the buffer according to a second control signal based on the scheduling.

8. The memory system according to claim 1, wherein the controller further comprises:

a control logic configured to track whether the iterative operations and the sub-iterative operations are performed and output the first control signal and the second control signal based on the scheduling.

* * * * *